(12) United States Patent
Chan et al.

(10) Patent No.: US 12,176,870 B2
(45) Date of Patent: Dec. 24, 2024

(54) RADIO FREQUENCY (RF) POWER MODULE HAVING A HIGH FREQUENCY SWITCHING ELECTRONIC POWER CONDITIONER COMBINED WITH A MILLIMETER WAVE TO TERAHERTZ VACUUM ELECTRONIC DEVICE

(71) Applicant: Elve Inc., Davis, CA (US)

(72) Inventors: Danny Chan, San Mateo, CA (US); Diana Gamzina Daugherty, Davis, CA (US); Richard Kowalczyk, Redwood City, CA (US); Daniel Springmann, Truckee, CA (US)

(73) Assignee: ELVE INC., Davis, CA (US)

( * ) Notice: Subject to any disclaimer, the term of this patent is extended or adjusted under 35 U.S.C. 154(b) by 0 days.

(21) Appl. No.: 18/657,220

(22) Filed: May 7, 2024

(65) Prior Publication Data

US 2024/0372516 A1    Nov. 7, 2024

Related U.S. Application Data

(60) Provisional application No. 63/464,599, filed on May 7, 2023.

(51) Int. Cl.
*H03F 1/00* (2006.01)
*H03F 3/24* (2006.01)

(52) U.S. Cl.
CPC ....... *H03F 3/245* (2013.01); *H03F 2200/171* (2013.01); *H03F 2200/451* (2013.01)

(58) Field of Classification Search
CPC ..... H03F 1/00; H03F 3/58; H03F 3/54; H03F 9/00
USPC ................... 330/41–45, 165, 276
See application file for complete search history.

(56) References Cited

U.S. PATENT DOCUMENTS

| | | | |
|---|---|---|---|
| 3,585,530 A * | 6/1971 | Wahlgren | H03C 1/20 332/181 |
| 6,262,536 B1 | 7/2001 | Symons | |
| 7,929,926 B2 * | 4/2011 | Mendenhall | H04L 27/361 375/302 |
| 9,125,261 B2 * | 9/2015 | Reed | H05B 45/48 |
| 2001/0011924 A1 | 8/2001 | Symons | |
| 2009/0272735 A1 * | 11/2009 | Suenaga | H05B 6/685 219/702 |
| 2010/0123403 A1 * | 5/2010 | Reed | H05B 45/46 315/193 |
| 2014/0217885 A1 | 8/2014 | Kemp | |
| 2019/0057829 A1 | 2/2019 | Ferrari et al. | |

FOREIGN PATENT DOCUMENTS

EP    1102388 B1    5/2001

* cited by examiner

*Primary Examiner* — Henry Choe
(74) *Attorney, Agent, or Firm* — Sheppard, Mullin, Richter & Hampton LLP

(57) ABSTRACT

A power module comprises a high frequency switching electronic power conditioner including stacked rectifier/filters, the stacked rectifier/filters generating stacked DC output voltages; and a vacuum electronic device coupled to the high frequency switching electronic power conditioner, the vacuum electronic device including components, each component receiving a respective DC output voltage of the stacked DC output voltages.

22 Claims, 7 Drawing Sheets

RADIO FREQUENCY (RF) POWER MODULE HAVING A HIGH FREQUENCY SWITCHING ELECTRONIC POWER CONDITIONER COMBINED WITH A MILLIMETER WAVE TO TERAHERTZ VACUUM ELECTRONIC DEVICE

PRIORITY CLAIM

This application claims benefit of and hereby incorporates by reference provisional patent application Ser. No. 63/464,599, entitled "RF Power Module Having a Millimeter Wave to Terahertz Vacuum Electronic Device Combined with a High Frequency Switching Electronic Power Conditioner," filed on May 7, 2023, by inventors Chan et al.

TECHNICAL FIELD

This invention relates generally to radio frequency (RF) power modules, and more particularly provides an RF power module having a high frequency switching electronic power conditioner combined with a millimeter wave to terahertz vacuum electronic device.

BACKGROUND

Radio frequency (RF) power modules (such as RF power amplifiers or oscillators) are used as RF generation or amplification stages in an RF network for a variety of applications, including imaging, radar and communications. Millimeter wave, sub-terahertz, and terahertz power modules are needed to achieve high resolution in imaging and radar systems or high data rates in communications systems.

SUMMARY

Radio frequency (RF) power modules (such as RF power amplifiers or oscillators) are used as RF generation or amplification stages in an RF network for a variety of applications, including imaging, radar, communications, and other applications. Millimeter wave, sub-terahertz, and terahertz power modules are needed to achieve high resolution in imaging and radar systems and high data rates in communications systems. High frequency switching electronic power conditioners offer a compact approach to achieve relatively high output voltages. The combination of a high frequency switching electronic power conditioner with a millimeter wave and up to terahertz vacuum electronic device enables implementation of a compact and efficient RF power module.

Traditionally, efficiency and power density in electronic power conditioners are challenging to achieve simultaneously, especially in electronic power conditioners that operate at relatively high voltage (up to 30 kV) and with high efficiency (over 85%). Further, as systems operate at lower power levels, such as those that millimeter wave to terahertz vacuum electronic devices could achieve, achievable power density typically decreases.

To achieve high efficiency and compact size in electronic power conditioners, high frequency switching power supply topologies may be used. Increasing the frequency switching to levels greater than 1 MHz increases the power density of lower voltage (<1 kV) power converters. Such a substantial increase in frequency allows the passive components in the converter to be reduced in value, enabling a significant reduction in size. For a high voltage electronic power conditioner, this applies particularly to magnetic components and output capacitors. Additionally, as output voltage increases, a reduction in output capacitance reduces stored energy available in the electronic power conditioner and in the resulting power module, allowing for safer operation in the event of a system fault. The use of a resonant inverter resonant rectifier converter topology reduces switching losses, enabling both compact and high efficiency energy conversion.

To achieve high efficiency in a vacuum electronic device, multi-stage depressed collectors may be used. The electromagnetic design of the vacuum electronic device focuses on exploiting a variety of potential interaction mechanisms between an electron beam and the co-propagating electromagnetic wave. After the interaction between the electron beam and the electromagnetic wave is complete, the spent electrons in the electron beam often have an energy spread, meaning that the spent electrons travel at a variety of velocities. Depressed collectors enable matching of electronic potentials of the spent electrons and as a result "recovering" their kinetic energy back to the power supply rather than converting the kinetic energy to heat. As a result, only a mismatch between the actual electron energy and the electronic potential of the individual collector electrode is converted to heat. Notably, depressed collectors have been demonstrated to convert electron beam energy back to electric current with efficiencies as high as 99%.

The number of depressed collector stages plays a role in the collector energy recovery efficiency. Due to a stacked output design of a high frequency resonant converter technology, the high frequency switching electronic power conditioner enables ready access to multiple collector voltages at a variety of potentials enabling overall system efficiency optimization.

In some embodiments, the present invention provides a power module comprising a high frequency switching electronic power conditioner including stacked rectifier/filters, the stacked rectifier/filters generating stacked DC output voltages; and a vacuum electronic device coupled to the high frequency switching electronic power conditioner, the vacuum electronic device including components, each component receiving a respective DC output voltage of the stacked DC output voltages.

The high frequency switching electronic power conditioner may have a switching frequency above 1 MHz. The vacuum electronic device may operate at frequencies between 28 GHz and 280 GHz. The vacuum electronic device may operate at frequencies between 280 GHz and 2.8 THz. The high frequency switching electronic power conditioner may employ a resonant topology. The components may include a set of depressed collector stages, and the stacked DC output voltages may include a set of DC output voltages for the set of depressed collector stages. The components may include a cathode and a cathode heater, and the stacked DC output voltages may include a cathode voltage and a cathode heater voltage. The cathode heater voltage may be referenced to (floated on) the cathode voltage.

The high frequency switching electronic power conditioner may include a high frequency inverter; a resonant tank; a transformer coupled to the resonant tank and to the set of stacked resonant rectifier/filters; and a controller configured to control a characteristic of the high frequency inverter to control the DC output voltage according to a specified tolerance. The controller may control the timing of the switching elements of the high frequency inverter. The transformer may include a primary winding and a set of secondary windings, each secondary winding coupled to a respective one of the stacked rectifiers/filters. The components may include a cathode, a cathode heater, and a set of depressed collector stages.

The high frequency switching electronic power conditioner may have a set of two or more power converter stages, each power converter stage including a high frequency inverter; a resonant tank; and a transformer coupled to the resonant tank and a respective one of the stacked rectifiers/filters. Each power converter stage may have a controller configured to control a characteristic of the high frequency inverter to control the respective DC output voltage of the power converter stage. At least one controller of at least one power converter stage may control the timing of the switching elements of the high frequency inverter of the power converter stage. The controller may be configured to control stability of the respective DC output voltage to a specified tolerance. A particular power converter stage may be configured to generate at least two DC output voltages, and the controller may be configured to control stability of the at least two DC output voltages to a specified tolerance. The transformer may include a primary winding and a secondary winding, the secondary winding coupled to a respective one of the stacked rectifiers/filters. A particular power converter stage may have a controller configured to control a characteristic of the high frequency inverter to control the respective DC output voltage of the particular power converter stage. The controller may be configured to control stability of the respective DC output voltage to a specified tolerance.

DETAILED DESCRIPTION

Figure 1:
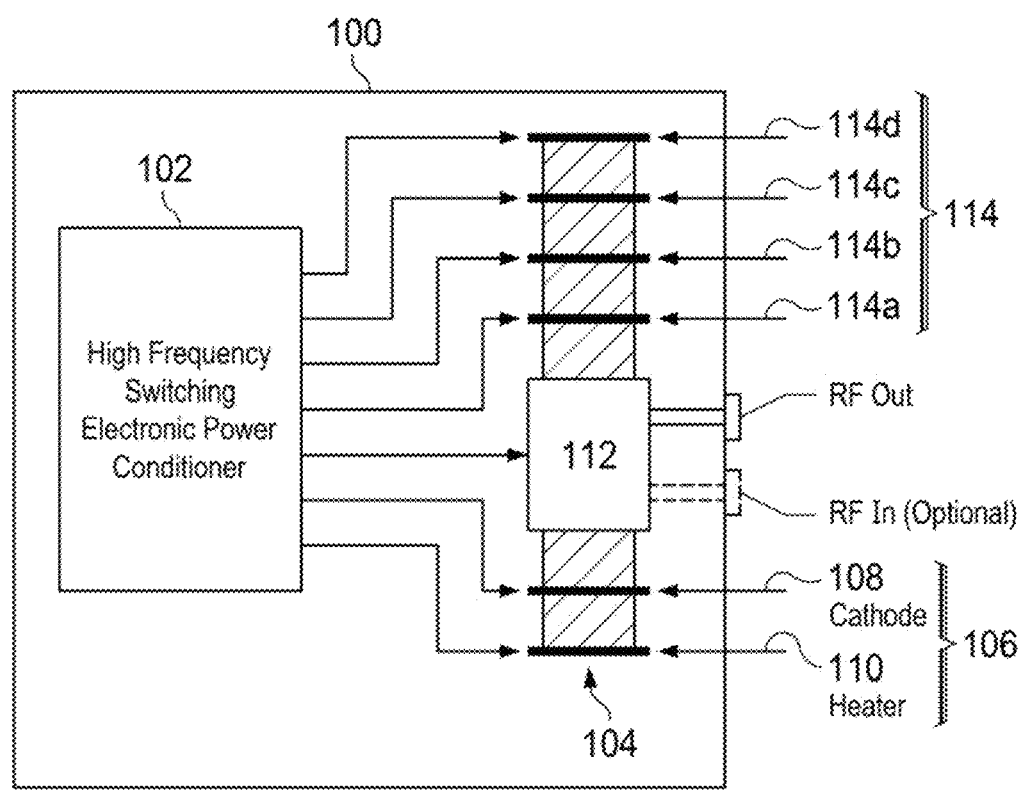
FIG. 1 is a diagram illustrating a power module comprising a high frequency switching electronic power conditioner combined with a millimeter wave to terahertz vacuum electronic device, in accordance with some embodiments of the present invention.

The following description is provided to enable a person skilled in the art to make and use various embodiments of the invention. Modifications are possible. The generic principles defined herein may be applied to the disclosed and other embodiments without departing from the spirit and scope of the invention. Thus, the claims are not intended to be limited to the embodiments disclosed, but are to be accorded the widest scope consistent with the principles, features and teachings herein.

Radio frequency (RF) power modules (such as RF power amplifiers or oscillators) are used as RF generation or amplification stages in an RF network for a variety of applications, including imaging, radar, communications, and other applications. Millimeter wave, sub-terahertz, and terahertz power modules are needed to achieve high resolution in imaging and radar systems and high data rates in communications systems. High frequency switching electronic power conditioners offer a compact approach to achieve relatively high output voltages. The combination of a high frequency switching electronic power conditioner with a millimeter wave and up to terahertz vacuum electronic device enables implementation of a compact and efficient RF power module.

Traditionally, efficiency and power density in electronic power conditioners are challenging to achieve simultaneously, especially in electronic power conditioners that operate at relatively high voltage (up to 30 kV) and with high efficiency (over 85%). Further, as systems operate at lower power levels, such as those that millimeter wave to terahertz vacuum electronic devices could achieve, achievable power density typically decreases.

To achieve high efficiency and compact size in electronic power conditioners, high frequency switching power supply topologies may be used. Increasing the frequency switching to levels greater than 1 MHz increases the power density of lower voltage (<1 kV) power converters. Such a substantial increase in frequency allows the passive components in the power supply to be reduced in value, enabling a significant reduction in size. For a high voltage electronic power conditioner, this applies particularly to magnetic components and output capacitors. Additionally, as output voltage increases, a reduction in output capacitance reduces stored energy available in the electronic power conditioner and in the resulting power module, allowing for safer operation in the event of a system fault. The use of a resonant inverter resonant rectifier converter topology reduces switching losses, enabling both compact and high efficiency energy conversion.

To achieve high efficiency in a vacuum electronic device, multi-stage depressed collectors may be used. The electromagnetic design of the vacuum electronic device focuses on exploiting a variety of potential interaction mechanisms between an electron beam and the co-propagating electromagnetic wave. After the interaction between the electron beam and the electromagnetic wave is complete, the spent electrons in the electron beam often have an energy spread, meaning that the spent electrons travel at a variety of velocities. Depressed collectors enable matching of electronic potentials of the spent electrons and as a result "recovering" their kinetic energy back to the power supply rather than converting the kinetic energy to heat. As a result, only a mismatch between the actual electron energy and the electronic potential of the individual collector electrode is converted to heat. Notably, depressed collectors have been demonstrated to convert electron beam energy back to electric current with efficiencies as high as 99%.

The number of depressed collector stages plays a role in the collector energy recovery efficiency. Due to a stacked output design of a high frequency resonant converter technology, the high frequency switching electronic power conditioner enables ready access to multiple collector voltages at a variety of potentials enabling overall system efficiency optimization.

FIG. 1 is a diagram illustrating an RF power module 100, in accordance with some embodiments of the present invention. The RF power module 100 comprises a high frequency switching electronic power conditioner 102 combined with a millimeter wave to terahertz vacuum electronic device 104 (e.g., an RF power amplifier such as a klystron or travelling wave tube (TWT), or an oscillator). The vacuum electronic device 104 may be operating at frequencies between 28 GHz and 280 GHz or at frequencies between 280 GHz and 2.8 THz.

As shown, the vacuum electronic device 104 includes an electron gun 106, which is coupled to an interaction structure 112, which is coupled to a depressed collector 114. The electron gun 106 may include a cathode 108 and a cathode heater 110. If the vacuum electronic device 104 is a power amplifier, the interaction structure 112 may have an RF input (RF-In) and an RF output (RF-Out). If the vacuum electronic device 104 is an oscillator, the interaction structure 112 may have only an RF output (RF-Out). The depressed collector 114 may have any number (N) of collector stages, e.g., four collector stages 114a-114d as shown.

Voltage-wise, in some embodiments, the electron gun 106 may receive two different voltages, one at cathode potential and one at cathode potential offset by the heater voltage (the offset heater voltage). The cathode 108 may receive the cathode voltage. The cathode heater 110 may receive a voltage generated from the cathode voltage and the offset heater voltage. In some embodiments, the cathode heater 110 is a floating voltage referenced to the cathode 108. In some embodiments, there are additional electrodes in the electron gun, with a voltage produced by the high efficiency switching electronic power conditioner 102 applied to each electrode. The body of the interaction structure 112 is maintained at ground potential. Each collector stage 114a-114d of the depressed collector 114 may operate at a different collector voltage based on the electronic potentials of the spent electrons the collector stage 114a-114d is designed to capture and thus the energy spread the collector stage 114a-114d is designed to recover. Accordingly, the depressed collector 114 may receive N different voltage potentials. The high frequency switching electronic power conditioner 102 is configured to generate the voltages needed by the vacuum electronic device 104, including the cathode voltage, the offset heater voltage, ground, and the N collector voltages. In some embodiments, the high frequency switching electronic power conditioner 102 has a stacked arrangement so that the DC output voltages build upon each other.

In some embodiments, the cathode 108 is heated by a resistive heater 110. To heat the cathode 108, a cathode voltage is applied to the electrode. Since the heater 110 is near or electrically connected to the cathode 108, the heater voltage may be configured to "float" on the cathode voltage. Thus, when the cathode voltage is at ground (i.e., the high cathode voltage is not energized), the heater current will be near ground also. When the cathode voltage is at its operating voltage, the heater voltage will be near or referenced to the cathode operating voltage. In such embodiments, the small voltage for the heater, which may be only a few volts, will stay close to the cathode voltage, which is likely varying from ground to kilovolts or tens of kilovolts. In some embodiments, this is accomplished by having the high frequency switching electronic power conditioner 102 implement a heater voltage that is referenced to (floating on) the cathode voltage.

For communication systems, it is critically important that the output signal of an RF power amplifier faithfully reproduce the input signal with only an increase in amplitude. If the voltages applied to the electrodes in the vacuum electronic device 104 are not sufficiently stable/constant, the voltage variation may cause the amplitude and/or phase of the output signal to shift. A shift in amplitude due to voltage variation is referred to as amplitude pushing factor. A shift in phase due to voltage variation is referred to as phase pushing factor. The vacuum electronic device 104 has associated pushing factor requirements for the voltages it receives. In addition to amplitude and phase distortions of the RF output signal, voltage variations can cause other undesirable effects. For example, if depressed collector voltages drift too far, spent electrons can be turned around by electrostatic repulsion. The spent electrons may travel backwards, causing undesired heating of the circuit or gun and reduced efficiency.

In view of the above problems caused by voltage variations, the high frequency switching electronic power conditioner 102 must be configured to maintain the voltages it provides sufficiently stable to within the performance requirements of the vacuum electronic device 104. Notably, it may be impractical to tightly regulate all of the voltages to the same tolerance, since doing so may result in large and/or expensive hardware. Accordingly, in some embodiments, the high frequency switching electronic power conditioner 102 may maintain each or subsets of its DC output voltages stable according to different tolerances. In other embodiments, the high frequency switching electronic power conditioner 102 may maintain some or all DC output voltages stable according to the same tolerance. The high frequency switching electronic power conditioner 102 may be designed to include individual regulation of each DC output voltage within a specified tolerance or cross-regulation of some or all DC output voltages within specified tolerances based on circuit design space.

In some embodiments, to effectively power a vacuum electronic device 104, a high frequency switching electronic power conditioner 102 may meet some or all of the characteristics noted in the table below.

| Requirements | Min | Max | Unit |
| --- | --- | --- | --- |
| Cathode voltage ripple (steady-state) | | 2 | Vpk-pk |
| Cathode voltage variation over temp & life | −50 | +50 | V |
| HV turn-on rise time, 10% to 90% | | 1 | ms |
| HV turn-off fall time, 10% to 90% | | 1 | ms |
| Heater voltage variation | −5 | +5 | % |
| Heater voltage ripple | | 50 | mVrms |
| Collector voltage ripple | | 10 | Vrms |
| Collector voltage variation over load, temp, life | −100 | +100 | V |

In some embodiments, the vacuum power device 104, such as a travelling wave tube, may have the following requirements to achieve overall RF power amplifier performance:

| Requirements | Min | Max | Unit |
| --- | --- | --- | --- |
| Cathode voltage amplitude pushing factor | | 0.3 | dB/kV |
| Cathode voltage phase pushing factor | | 1 | deg/V |

-continued

| Requirements | Min | Max | Unit |
|---|---|---|---|
| Heater voltage amplitude pushing factor | | 0.1 | dB/kV |
| Heater voltage phase pushing factor | | 0.1 | deg/V |
| Peak body current over range of cathode voltage from zero to nominal | | 10 | mA |
| Collector voltage amplitude pushing factor | | 0.01 | dB/kV |
| Collector voltage phase pushing factor | | 0.01 | deg/V |
| Collector voltage margin to reflected electrons | −500 | +500 | V |

To achieve the desired performance characteristics of the RF power module 100, in some embodiments, the high frequency switching electronic power conditioner 102 and the vacuum electronic device 104 may be co-designed. Accordingly, sub-component specifications can be developed to ensure that each part meets individual specifications. With knowledge of the performance requirements and related voltage sensitivities of the vacuum electronic device 104, a high frequency switching electronic power conditioner 102 can be developed that meets the requirements. Co-developing the high frequency switching electronic power conditioner 102 and the vacuum electronic device 104 together allows for optimization of the entire power module 100 as a complete system, affording the design of both components to be tailored to work together, given the design space of each.

Figure 2:
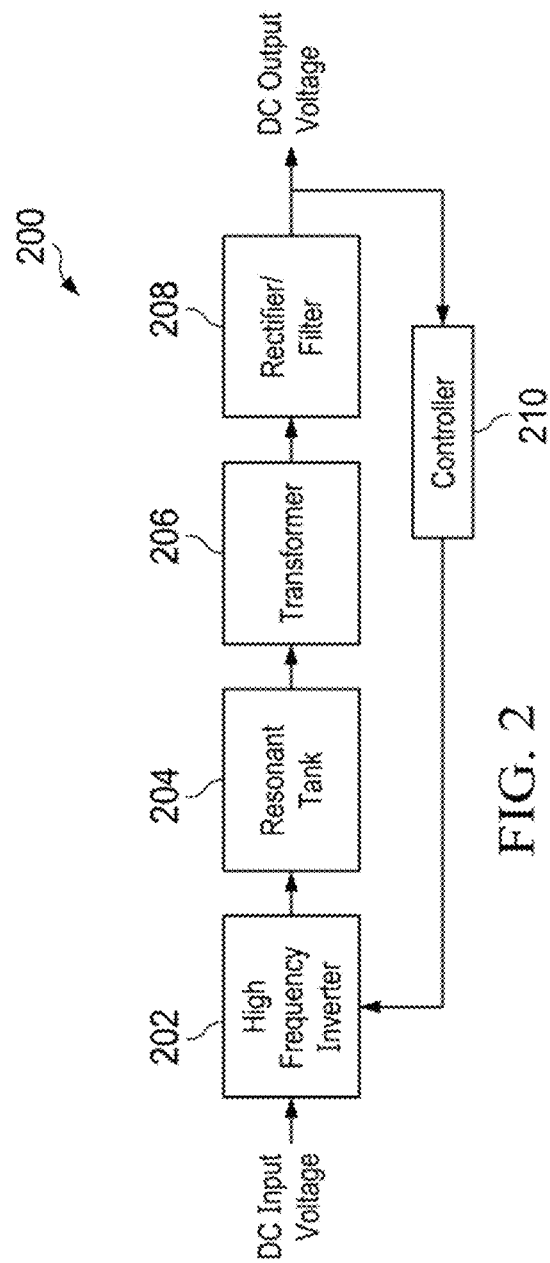
FIG. 2 is a diagram illustrating a high frequency switching electronic power conditioner providing a single direct current (DC) output voltage, in accordance with some embodiments of the present invention.

FIG. 2 is a diagram illustrating a high frequency switching electronic power conditioner 200 that provides a single direct current (DC) output voltage, in accordance with some embodiments of the present invention. In some embodiments, to achieve high efficiency and power density, the high frequency switching electronic power conditioner 200 may be implemented using a high frequency switching resonant converter topology. The high frequency switching electronic power conditioner 102 may operate in a similar manner as the high frequency switching electronic power conditioner 200, although with replicated stages to generate multiple DC output voltages. See FIGS. 3A and 3B as one example and FIGS. 4A and 4B as another example.

In some embodiments, the high frequency switching electronic power conditioner 200 includes a high frequency inverter 202 coupled to a resonant tank 204 in turn coupled to a transformer 206 in turn coupled to a resonant rectifier/filter 208. The inverter 202, operating at high frequency (e.g., >1 MHz) receives a DC input voltage, which together with the resonant tank 204 converts the voltage and/or current waveforms to vary sinusoidally during one or more sub-intervals of each switching period. The sinusoidally varying waveforms allow the active components, switches and rectifiers in the circuit to switch with minimal energy loss during their respective switching transitions. The transformer 206 receives the modified AC square wave from the resonant tank 204, and transforms the voltage of the modified AC square wave based on the number of primary to secondary windings. The resonant rectifier/filter 208 receives, rectifies and filters the voltage-modified AC wave to generate a DC output voltage to power its load. As indicated above, different sections of the circuit may be replicated (e.g., stacked) to generate multiple DC output voltages.

The high frequency switching electronic power conditioner 200 may further include a controller 210 that compares the DC output voltage, perhaps against a reference voltage or reference voltage range, and controls the high frequency inverter 202 to adjust its frequency and/or duty cycle to adjust the DC output voltage as needed. In some embodiments, the controller 210 may be or include a pulse width modulation (PWM) controller that controls the duty cycle of the high frequency inverter 202 to affect the DC output voltage as needed. The controller 210 may be regulated to tightly maintain the DC output voltage to a specified tolerance. For example, the reference voltage range (e.g., any hysteresis) may be held tight based on the specified tolerance.

By increasing the frequency of the high frequency inverter 202 to frequencies above 1 MHz, the size of the passive components, including the transformer 206 as well as the inductors and capacitors in the resonant tank 204 and resonant rectifiers/filters 208 effectively reduce in size, thereby enabling a reduction in size of the high frequency switching electronic power conditioner 200.

Figure 3A:
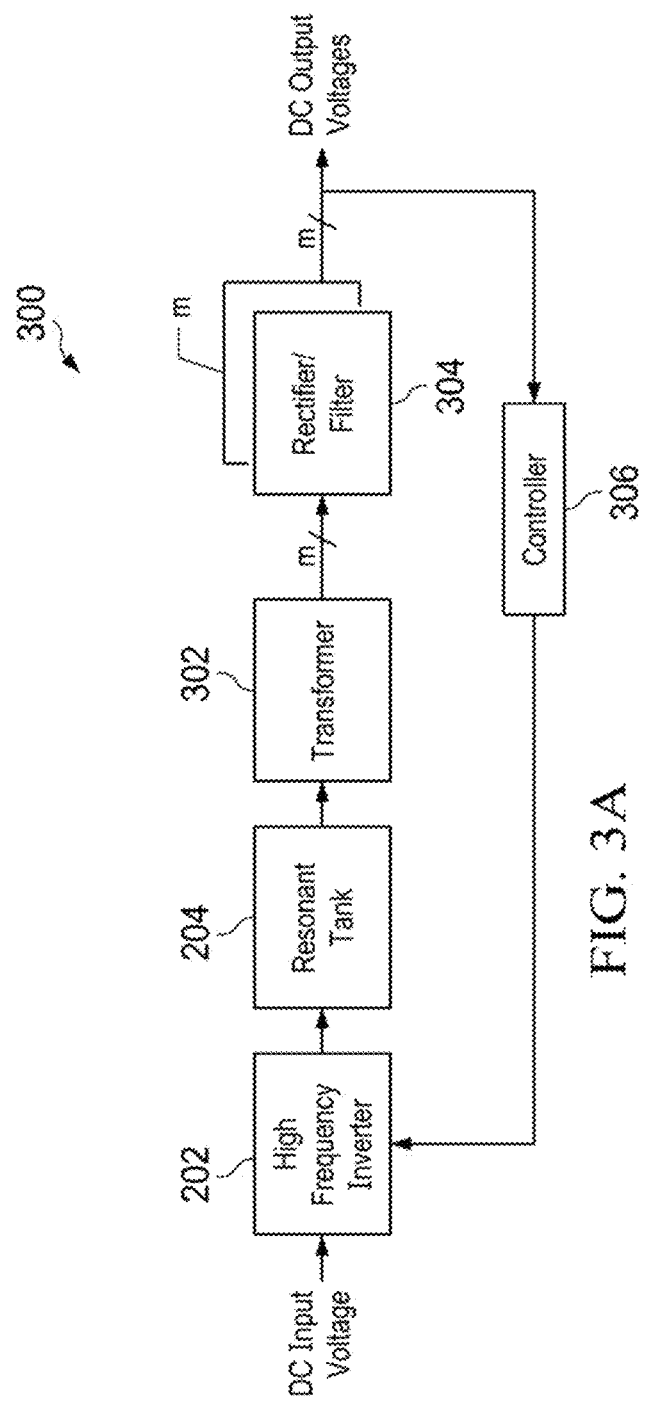
FIG. 3A is a diagram illustrating a high frequency switching electronic power conditioner with parallel rectifier/filters to generate multiple DC output voltages, in accordance with some embodiments of the present invention.

FIG. 3A is a diagram illustrating a high frequency switching electronic power conditioner 300 with parallel, possibly stacked, resonant rectifier/filters to generate multiple DC output voltages, in accordance with some embodiments of the present invention. The high frequency switching electronic power conditioner 300 may be an example of the high frequency switching electronic power conditioner 102. The high frequency switching electronic power conditioner 300 is similar to the high frequency switching electronic power conditioner 200, except that the transformer 302 includes multiple (m) parallel secondary windings, wherein each secondary winding is coupled to a parallel rectifier/filter 304 that generates a respective DC output voltage. Each parallel rectifier/filter 304 receives, rectifies and filters the voltage-modified AC wave coming from its parallel secondary winding to generate a respective DC output voltage needed by the vacuum electronic device 104. That is, each parallel resonant rectifier/filter 304 may generate one of the cathode voltage, the offset heater voltage, and the N collector voltages. In some embodiments, the cathode voltage and the offset heater voltage may be generated by the same resonant rectifier/filter 304. In some embodiments, the number of secondary windings in each secondary winding may differ based on the desired DC output voltage. In some embodiments, circuit components in the parallel resonant rectifier/filter 304 may differ based on the desired DC output voltage. In some embodiments, both may differ.

The high frequency switching electronic power conditioner 300 may further include a controller 306 that compares the DC output voltage of at least one of the parallel rectifiers/filters 304, possibly relative to a reference voltage or a reference voltage range, and controls the high frequency inverter 202 to adjust an inverter characteristic, e.g., its respective frequency, phase and/or duty cycle, to adjust the DC output voltages as needed. In some embodiments, the controller 306 may be or include a pulse width modulation (PWM) controller that controls the duty cycle of the high frequency inverter 202 to affect the DC output voltages as needed. The controller 210 may be regulated to tightly maintain the DC output voltage to a specified tolerance. For example, the reference voltage range (e.g., any hysteresis) may be held tighter based on the specified tolerance. In some embodiments, the specified tolerance may be the tightest tolerance required by the most sensitive voltage of the vacuum electronic device 104.

Figure 3B:
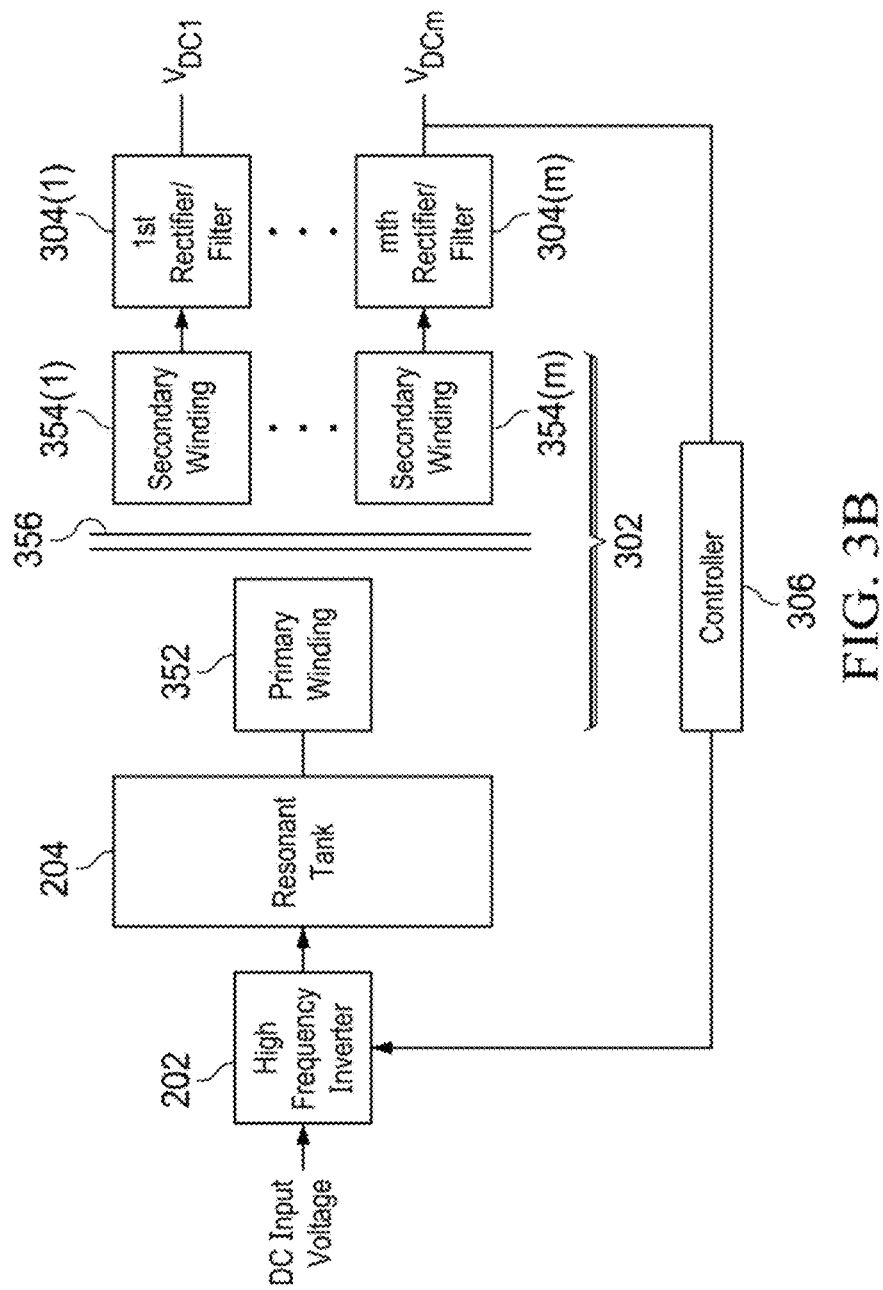
FIG. 3B is a diagram illustrating the high frequency switching electronic power conditioner of FIG. 3A, in accordance with some embodiments of the present invention.

FIG. 3B is a diagram illustrating the high frequency switching electronic power conditioner 300, in accordance with some embodiments of the present invention. The high frequency switching electronic power conditioner 300 includes the high frequency inverter 202 coupled to the resonant tank 204 in turn coupled to the transformer 302 in turn coupled to the parallel resonant rectifier/filters 304. The transformer 302 includes a primary winding 352 (which may or may not have center-tapped configuration) coupled via a core 356 to secondary windings 354(1)-354(m) (each generally referred to as a secondary winding 354) (which each may or may not have center-tapped configuration). Each secondary winding 354(1)-354(m) is respectively coupled to a respective resonant rectifier/filter 304(1)-304(m) (each generally referred to as a resonant rectifier/filter 304). Each resonant rectifier/filter 304(1)-304(m) generates a respective DC output voltage Vdc1-Vdcm.

As similarly stated with regard to FIG. 2, the inverter 202, operating at high frequency (e.g., >1 MHz) receives a DC input voltage, which together with the resonant tank 204 converts the voltage and/or current waveforms to vary sinusoidally during one or more sub-intervals of each switching period. The sinusoidally varying waveforms allow the active components, switches and rectifiers in the circuit to switch with minimal energy loss during their respective switching transitions. The transformer 206 receives the modified AC square wave from the resonant tank 204, and transforms the voltage of the modified AC square wave based on the number of primary to secondary windings of each respective secondary winding 354. Each respective resonant rectifier/filter 304 receives, rectifies and filters its voltage-modified AC wave to generate a respective DC output voltage to power its respective load. As indicated above, the number of windings in each secondary winding may differ based on the desired DC output voltage. In some embodiments, circuit components in the parallel resonant rectifier/filter 304 may differ based on the desired DC output voltage. In some embodiments, both may differ.

As indicated above, the high frequency switching electronic power conditioner 300 may further include the controller 306 that compares the DC output voltage of at least one of the resonant rectifiers/filters 304, e.g., resonant rectifier/filter 304(m), possibly relative to a reference voltage or reference voltage range, and controls the high frequency inverter 202 to adjust an inverter characteristic, e.g., its respective frequency, phase and/or duty cycle, to adjust the DC output voltages as needed. In some embodiments, the controller 306 may be or include a pulse width modulation (PWM) controller that controls the duty cycle of the high frequency inverter 202 to affect the DC output voltages as needed. The controller 210 may be regulated to tightly maintain the DC output voltage to a specified tolerance. For example, the reference voltage range (e.g., any hysteresis) may be held tight based on the specified tolerance. In some embodiments, the specified tolerance may be the tightest tolerance required by the most sensitive voltage requirement of the vacuum electronic device 104.

Figure 4A:
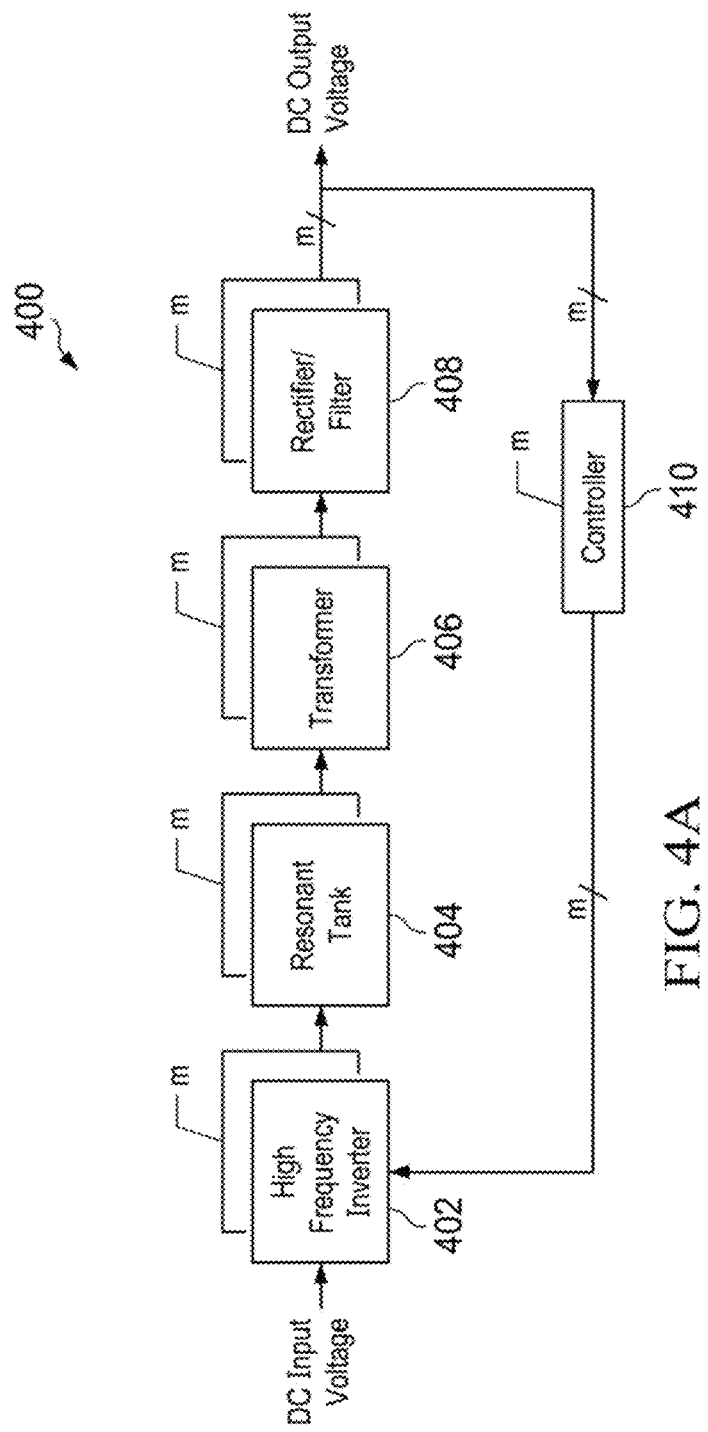
FIG. 4A is a diagram illustrating a high frequency switching electronic power conditioner with parallel power converters to generate multiple DC output voltages, in accordance with some embodiments of the present invention.

FIG. 4A is a diagram illustrating a high frequency switching electronic power conditioner 400 with parallel power converter stages to generate the multiple DC output voltages, in accordance with some embodiments of the present invention. In some embodiments, the high frequency switching electronic power conditioner 400 includes a set of parallel high frequency inverters 402 coupled to a set of parallel resonant tanks 404 in turn coupled to a set of parallel transformers 406 in turn coupled to a set of parallel rectifiers/filters 408. In other words, the high frequency switching electronic power conditioner 400 includes several parallel power converter stages, each power converter stage having a respective parallel high frequency inverter 402 coupled to a respective resonant tank 404 in turn coupled to a respective transformer 406 in turn coupled to a respective resonant rectifier/filter 408. Each power converter stage generates a respective DC output voltage (or possibly a subset of DC output voltages) that can be regulated according to different tolerance levels. In some embodiments, a set of some or all of the parallel resonant rectifier/filters 408 may be stacked to establish increasing DC output voltages relative to each other in the set.

In some embodiments, the set of high frequency inverters 402 receive a DC input voltage. Each inverter 402, operating at high frequency (e.g., >1 MHz), receives a DC input voltage, which together with the resonant tank 204 converts the voltage and/or current waveforms to vary sinusoidally during one or more sub-intervals of each switching period. The sinusoidally varying waveforms allow the active components, switches and rectifiers in the circuit to switch with minimal energy loss during their respective switching transitions. Each transformer 406 receives the modified AC square wave from the associated resonant tank 404, and transforms the voltage of the modified AC square wave based on the number of primary to secondary windings. Each resonant rectifier/filter 408 receives, rectifies and filters the voltage-modified AC wave to generate a respective DC output voltage to power a respective load. In some embodiments, a respective resonant rectifier/filters 408 may be stacked to establish an increasing DC output voltage relative to the floating DC output voltage of the previous resonant rectifier/filter 408 upon which it is stacked.

The high frequency switching electronic power conditioner 400 may further include a set of parallel controllers 410. In other words, each parallel converter stage may have a respective controller 410 that compares its respective DC output voltage, perhaps relative to a respective reference voltage or reference voltage range, and controls the respective high frequency inverter 402 to adjust an inverter characteristic, e.g., its respective frequency, phase and/or duty cycle, to adjust the respective DC output voltage as needed. In some embodiments, one or more of the controllers 410 may be or include a pulse width modulation (PWM) controller that controls the duty cycle of the high frequency inverter 402 to affect the DC output voltage as needed. By using a separate controller 410 in each converter stage, the respective DC output voltage may be maintained sufficiently stable according to a different tolerance specification. In some embodiments, only a single controller 410 is needed, especially if the resonant rectifier/filters 408 are stacked, the resonant rectifier/filters 408 are stable, and the specified tolerance requirement is consistent across all of the DC output voltages.

Figure 4B:
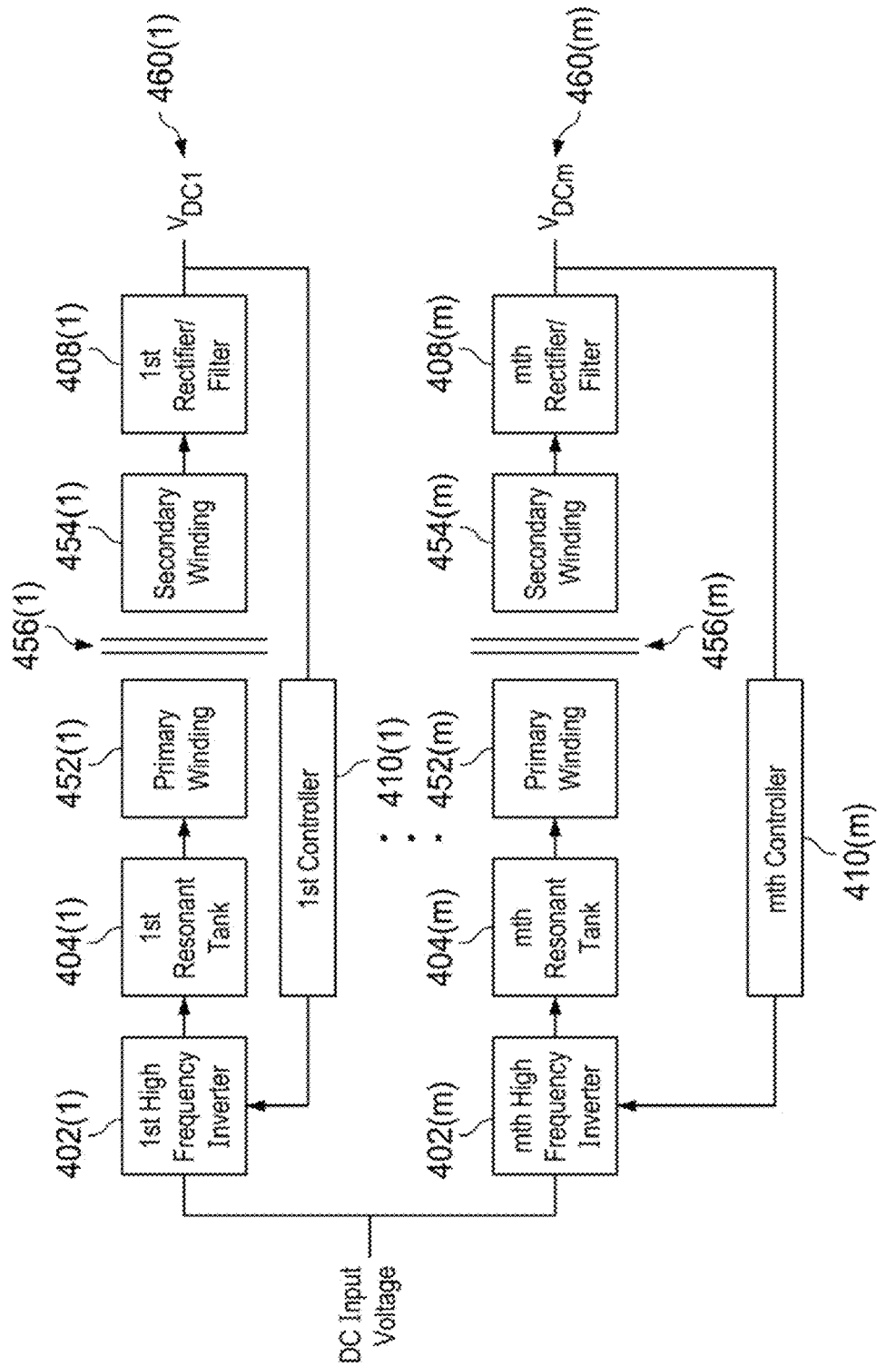
FIG. 4B is a diagram illustrating the high frequency switching electronic power conditioner of FIG. 4A, in accordance with some embodiments of the present invention.

FIG. 4B is a diagram illustrating a high frequency switching electronic power conditioner 400 with parallel power converter stages 460(1)-460(m) (each generally referred herein as a power converter stage 460) to generate the multiple DC output voltages, in accordance with some embodiments of the present invention. The high frequency switching electronic power conditioner 400 includes several parallel power converter stages 460(1)-(m), each power converter stage 460 having a respective high frequency inverter 402 coupled to a respective resonant tank 404 in turn coupled to a respective transformer 406 in turn coupled to a respective resonant rectifier/filter 408. As shown, the first power converter stage 460(1) includes a first high frequency inverter 402(1) coupled to a first resonant tank 404(1) in turn coupled to a first primary winding 452(1) in turn coupled via a first core 456(1) to a first secondary winding 454(1) of a first transformer 406 in turn coupled to a first resonant rectifier/filter 408(1). As shown, the mth power converter stage 460(m) includes an mth high frequency inverter 402(m) coupled to an mth resonant tank 404(m) in turn coupled to an mth primary winding 452(m) in turn coupled via an mth core 456(m) to an mth secondary winding 454(m) of an mth transformer 406 in turn coupled to an mth resonant rectifier/filter 408(m). Each power converter stage generates a respective DC output voltage (or possibly a subset of DC output voltages). In some embodiments, a set of some or all of the resonant rectifier/filters 408 may be stacked to establish increasing DC output voltages relative to each other in the set.

In some embodiments, each high frequency inverter 402(1)-402(m) receives a DC input voltage. Each inverter 402(1)-(m), operating at high frequency (e.g., >1 MHz), receives a DC input voltage, which together with the resonant tank 404(1)-(m) converts the voltage and/or current waveforms to vary sinusoidally during one or more sub-intervals of each switching period. The sinusoidally varying waveforms allow the active components, switches and rectifiers in the circuit to switch with minimal energy loss during their respective switching transitions. Each transformer 406 receives the modified AC square wave from the associated resonant tank 404(1)-(m), and transforms the voltage of the modified AC square wave based on the number of primary to secondary windings in the respective primary winding 452(1)-(m) and secondary winding 454(1)-(m). Each resonant rectifier/filter 408(1)-(m) receives, rectifies and filters the voltage-modified AC wave to generate a respective DC output voltage to power a respective load. In some embodiments, a respective resonant rectifier/filter 408(1)-(m) may be stacked to establish an increasing DC output voltage relative to the floating DC output voltage of the previous resonant rectifier/filter 408(1)-(m) upon which it is stacked.

One, some or all of the power converter stages 460(1)-(m) of the high frequency switching electronic power conditioner 400 may further include a respective controller that compares its respective DC output voltage, perhaps relative to a respective reference voltage or reference voltage range, and controls the respective high frequency inverter 402(1)-(m) to adjust an inverter characteristic, e.g., its respective frequency, phase and/or duty cycle, to adjust the respective DC output voltage as needed. In some embodiments, one or more of the controllers 410(1)-(m) may be or include a pulse width modulation (PWM) controller that controls the duty cycle of the respective high frequency inverter 402(1)-(m) to affect the DC output voltage as needed. By using a separate controller 410(1)-(m) in each power converter stage 460, the respective DC output voltage may be maintained sufficiently stable according to a different tolerance specification. In some embodiments, only a single controller 410 is needed, especially if the resonant rectifier/filters 408(1)-(m) are stacked, the resonant rectifier/filters 408(1)-(m) are stable, and the specified tolerance requirement is consistent across all of the DC output voltages.

It will be appreciated that some embodiments may include a parallel power converter stage shown in FIG. 4B combined with parallel resonant rectifiers/filters 304 as shown in FIG. 3B.

The use of high frequency switching allows smaller modular power converter stages or modules that can be configured in both series and parallel to achieve the design voltages and design power handling capability. This enables a modular design that can support different power amplifier requirements for operating voltage, number of collector stages, and total power levels. The modular approach allows for quickly adapting the design to improve the operation of the power amplifier. Stages can be used in parallel and scaled up and down to achieve needed power amplifier performance as described above. If a vacuum electronic device 104 turns out to operate better with different settings than was originally designed, or at different settings for a different use case, the high frequency switching electronic power conditioner 102 can be quickly reconfigured. The stages can be physical modules fabricated as individual PCB assemblies, or can be "patterns" that are used during the design stage, and then fabricated as parts of a larger PCB assembly.

Figure 5:
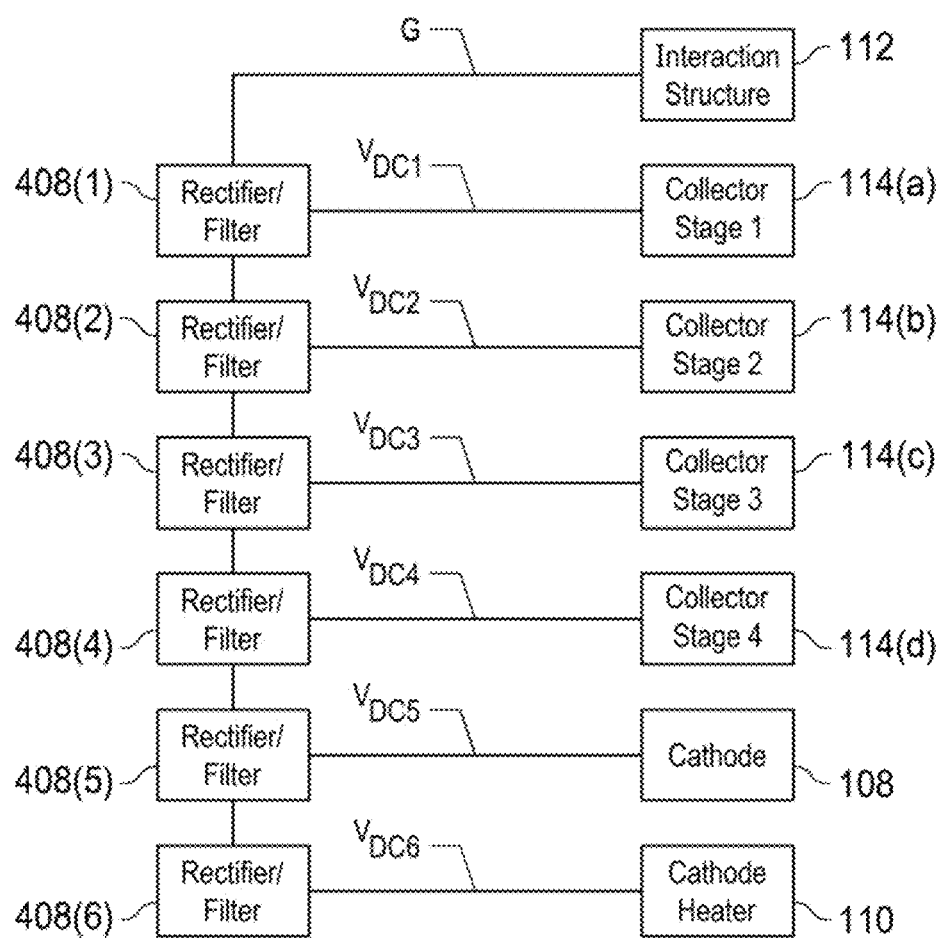
FIG. 5 is a diagram illustrating stacked rectifiers/filters 408, which stack respective DC output voltages Vdc to power the different components of the vacuum electronic device 104, in accordance with some embodiments of the present invention.

FIG. 5 is a diagram illustrating stacked rectifiers/filters 408, which stack respective DC output voltages Vdc to power the different components of the vacuum electronic device 104, in accordance with some embodiments of the present invention. The stacked rectifier/filters 408 may be part of the high frequency switching electronic power conditioner 300 or switching electronic power conditioner 400. More particularly, the first rectifier/filter 408(1) may generate a ground potential for the interaction structure 112 and a first DC output voltage Vdc(1) to power the first collector stage 114(a). The second rectifier/filter 408(2) may generate a second DC output voltage Vdc(2) floating above the first DC output voltage Vdc(1) to power the second collector stage 114(b). The third rectifier/filter 408(3) may generate a third DC output voltage Vdc(3) floating above the second DC output voltage Vdc(2) to power the third collector stage 114(c). The fourth rectifier/filter 408(4) may generate a fourth DC output voltage Vdc(4) floating above the third DC output voltage Vdc(3) to power the fourth collector stage 114(d). The fifth rectifier/filter 408(5) may generate a fifth DC output voltage Vdc(m) floating above the fourth DC output voltage Vdc(4) to power the cathode 108. The sixth rectifier/filter 408(6) may generate a sixth DC output voltage Vdc(6) floating above the fifth DC output voltage Vdc(5) to power the cathode heater 110. Other embodiments are possible. For example, in some embodiments, there may be fewer or additional collector stages. In some embodiments, a single rectifier/filter 408 may generate multiple voltages to power multiple components of the vacuum electronic device 104.

In some embodiments, cathode regulation needs to be fairly tight while at high voltage (constant DC while with low ripple) to achieve low spurious distortion of the RF signal. Body current is current flowing from cathode to ground (not to the collector). Body current is affected by the RF input signal, so it is a variable loading on the cathode voltage generation system. To prevent collector backstreaming, stability of the collector electrode voltages must be maintained in the presence of dynamically changing loads (i.e., the current flowing to the collector stages is determined by the RF signal applied). The operating conditions for no RF output through full saturated RF output operation vary significantly for the collectors-meaning the power supply sees varying loads on each electrode. Since this variation can happen at RF frequencies, the loads can be changing fast. The power supply design must be suitable to maintain regulation in the presence of these rapidly changing loads.

The design of the high frequency switching electronic power conditioner 102 is affected by the design of the vacuum electronic device 104 which hence affects the efficiency and overall prime power; efficiency and size are impacted by the quality of the design, so ensuring that only necessary design details are implemented is instrumental to the rapid design cycles. A three way optimization may be performed for size, power (efficiency), and performance.

As electrons leave the cathode, electrons carry thermal energy with them, cooling the cathode. The performance of the cathode, in terms of its ability to produce the required current, depends on controlling the temperature. As the vacuum electronic device 104 operates at higher duty cycle, up to CW, increasing heater power is needed to maintain the cathode at the design temperature to provide the required cathode current. The power module may incorporate various approaches to maintain the temperature. In one embodiment, a lookup table or analog circuit is used to adjust the heater power based on the duty cycle at which the unit is being operated. In another embodiment, the cathode current is sensed, and a feedback loop is used to control the heater power to maintain the emitted cathode current within the desired range.

Noise power is an important characteristic of an RF power amplifier, since it provides a limit on the signal to noise ratio that can be achieved, thus limiting the total data-rate that can be achieved with a communication system. One measure of this is Error Vector Magnitude, which characterizes the error in the constellation plot when a communication system handles a waveform. The RF noise is affected by electronic noise on the cathode voltage as well as noise in the vacuum electronic device 104 (shot noise among others). Achieving the required RF performance requires proportioning allowed noise in the vacuum electronic device 104.

For power amplifiers that use a configuration with no control electrodes in the gun, the amplifiers need not have a module to turn the beam ON and OFF that is otherwise common in regular vacuum electronic device power supplies. This makes the overall system more compact (no mod anode or beam modulator/grid/aperture grid needed). For these amplifiers in particular, during turn-on and turn-off, the vacuum electronic device 104 and high frequency switching electronic power conditioner 102 have to operate through conditions other than the nominal. At low cathode voltage, the vacuum electronic device 104 may have poor beam transmission, so the system will run through a period of high body current during the turn-on and turn-off transient. This can cause damage to the vacuum electronic device 104, or it can cause damage to the high voltage switching electronic power conditioner 102, or it can cause the high voltage switching electronic power conditioner 102 to self-protect by entering a fault state. Each of these outcomes is undesirable in being able to field the system. The designer must ensure that the combination of the rise and fall time of the high voltage switching electronic power conditioner 102 output voltage along with the vacuum electronic device 104 thermal robustness can survive the transient conditions during turn-on and turn-off. The designer must also ensure that the high voltage switching electronic power conditioner 102 protection circuitry is configured to allow the unit to "ride through" the turn-on transient power surge if it exceeds the protection limits for a short period of time.

The high frequency switching electronic power conditioner 102 must be able to survive arcs from any electrode to any electrode or from any electrode to ground in the vacuum electronic device 104. Additionally, the high frequency switching electronic power conditioner 102 must ensure the vacuum electronic device 104 is not damaged due to an arc event. In some configurations, this can entail fast protection circuits designed to remove voltage when an arc is detected. In other embodiments, this can involve choices about the amount of stored energy available to supply an arc and controlling where and how the stored energy is dissipated within the complete arc path along with slower protection circuits.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The foregoing description of the preferred embodiments of the present invention is by way of example only, and other variations and modifications of the above-described embodiments and methods are possible in light of the foregoing teaching. The embodiments described herein are not intended to be exhaustive or limiting. The present invention is limited only by the following claims.

The invention claimed is:

1. A power module comprising:
a high frequency switching electronic power conditioner including stacked resonant rectifier/filters, the stacked resonant rectifier/filters configured to generate stacked direct current (DC) output voltages, the stacked DC output voltages including a first DC output voltage, a second DC output voltage and a third DC output voltage, the second DC output voltage floating on the first DC output voltage, the third DC output voltage floating on the second DC output voltage; and
a vacuum electronic device (VED) coupled to the high frequency switching electronic power conditioner, the vacuum electronic device including VED components, the VED components including a cathode, a cathode heater and at least one collector stage, each VED component configured to receive a respective DC output voltage of the stacked DC output voltages.

2. The power module of claim 1, wherein the high frequency switching electronic power conditioner includes a high frequency inverter configured to receive a DC input signal and to generate an alternating output signal having a switching frequency above 1 MHz.

3. The power module of claim 1, wherein the vacuum electronic device is operating on a radio frequency (RF) signal having a switching frequency between 28 GHz and 280 GHz.

4. The power module of claim 1, wherein the vacuum electronic device is operating on a radio frequency (RF) signal having a switching frequency between 280 GHz and 2.8 THz.

5. The power module of claim 1, wherein the at least one collector stage includes a set of depressed collector stages, and wherein the stacked DC output voltages includes a set of DC output voltages for the set of depressed collector stages.

6. The power module of claim 1, wherein the stacked DC output voltages includes a cathode voltage and a cathode heater voltage.

7. The power module of claim 6, wherein the cathode heater voltage is generated by floating the cathode heater voltage on the cathode voltage by an offset voltage.

8. A power module, comprising:
a high frequency switching electronic power conditioner including stacked resonant rectifier/filters, the stacked resonant rectifier/filters configured to generate stacked direct current (DC) output voltages, the high frequency switching electronic power conditioner including a high frequency inverter;
a resonant tank;
a transformer coupled to the resonant tank and to the set of stacked resonant rectifier/filters; and
a controller configured to control a characteristic of the high frequency inverter to control at least one of the stacked DC output voltages according to a specified tolerance; and
a vacuum electronic device (VED) coupled to the high frequency switching electronic power conditioner, the VED including VED components, each VED component configured to receive a respective DC output voltage of the stacked DC output voltages.

9. The power module of claim 8, wherein the controller includes pulse width modulation that controls a duty cycle of the high frequency inverter.

10. The power module of claim 8, wherein the transformer includes a primary winding and a set of secondary windings, each secondary winding coupled to a respective one of the stacked rectifiers/filters.

11. A power module, comprising:
a high frequency switching electronic power conditioner including stacked resonant rectifier/filters, the stacked resonant rectifier/filters configured to generate stacked direct current (DC) output voltages, the high frequency switching electronic power conditioner having a set of two or more power converter stages, each power converter stage including
a high frequency inverter;
a resonant tank; and
a transformer coupled to the resonant tank and a respective one of the stacked resonant rectifiers/filters; and
a vacuum electronic device (VED) coupled to the high frequency switching electronic power conditioner, the VED including VED components, each VED component configured to receive a respective DC output voltage of the stacked DC output voltages.

12. The power module of claim 11, wherein each power converter stage has a controller configured to control a characteristic of the high frequency inverter to control the respective DC output voltage of the power converter stage.

13. The power module of claim 12, wherein at least one controller of at least one power converter stage includes pulse width modulation that controls a duty cycle of the high frequency inverter of the at least one power converter stage.

14. The power module of claim 11, wherein the controller is configured to control stability of the respective DC output voltage to a specified tolerance.

15. The power module of claim 11, wherein a particular power converter stage is configured to generate at least two DC output voltages, and wherein the controller is configured to control stability of the at least two DC output voltages to a specified tolerance.

16. The power module of claim 11, wherein the transformer includes a primary winding and a secondary winding, the secondary winding coupled to a respective one of the stacked resonant rectifiers/filters.

17. The power module of claim 11, wherein a particular power converter stage has a controller configured to control a characteristic of the high frequency inverter to control the respective DC output voltage of the particular power converter stage.

18. The power module of claim 17, wherein the controller is configured to control stability of the respective DC output voltage to a specified tolerance.

19. The power module of claim 1, wherein the second DC output voltage is floated indirectly on the first DC output voltage.

20. The power module of claim 1, wherein the third DC output voltage is floated indirectly on the second DC output voltage.

21. The power module of claim 1, wherein a particular resonant rectifier/filter of the stacked resonant rectifier filters generates both the second DC output voltage and the third DC output voltage.

22. The power module of claim 1, wherein a particular resonant rectifier/filter of the stacked resonant rectifier filters generates both the first DC output voltage and the second DC output voltage.

* * * * *